(12) United States Patent
Lin

(10) Patent No.: US 7,174,951 B1
(45) Date of Patent: Feb. 13, 2007

(54) RADIATOR MODULE STRUCTURE

(75) Inventor: Sheng-Huang Lin, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 0 days.

(21) Appl. No.: 11/213,694

(22) Filed: Aug. 30, 2005

(51) Int. Cl.
  *F28D 15/00* (2006.01)
  *H05K 17/20* (2006.01)

(52) U.S. Cl. ............... 165/104.33; 165/80.3; 165/104.21; 165/104.34

(58) Field of Classification Search ............... 165/80.3, 165/185, 104.33, 104.34, 104.21, 121, 122; 361/697, 700; 257/715, 718–719; 174/15.2, 174/16.3
See application file for complete search history.

(56) References Cited

U.S. PATENT DOCUMENTS

| | | | |
|---|---|---|---|
| 6,394,175 B1* | 5/2002 | Chen et al. ................ | 165/80.3 |
| 6,625,021 B1* | 9/2003 | Lofland et al. ............. | 361/697 |
| 6,789,312 B2* | 9/2004 | White ......................... | 29/832 |
| 6,909,608 B2* | 6/2005 | Fan ............................. | 361/700 |
| 6,948,555 B1* | 9/2005 | Garcia ........................ | 165/80.3 |
| 2005/0061476 A1* | 3/2005 | Artman et al. ............. | 165/80.3 |
| 2005/0099774 A1* | 5/2005 | Song ........................... | 361/700 |
| 2005/0225943 A1* | 10/2005 | Shih et al. ................. | 361/700 |

* cited by examiner

Primary Examiner—Tho Duong

(57) ABSTRACT

A radiator module structure includes at least a heat guide pipe, a frame member, a fan and at least two cooling fin sets. The guide pipe has a heat receiving section joined to a base and at least two heat dissipation sections extending upward and being away the base. The frame member is upright disposed on the base and faces the heat receiving section. The frame part of the frame member at least has a clip hook part at the bottom thereof to engage with base and the fan is received in the frame part to respectively face the two cooling fin sets, which are penetrated with the heat dissipation sections.

4 Claims, 13 Drawing Sheets

RADIATOR MODULE STRUCTURE

BACKGROUND OF THE INVENTION

1. Field of the Invention

The present invention is related to a radiator module structure and particularly to a radiator module structure enhancing heat dissipation.

2. Brief Description of the Related Art

Due to high technology progressing rapidly, electronic component such as CPU is getting minimized in size and the intensity of unit area is getting higher. Thus, the performance thereof is getting higher incessantly. Hence, the gross generated heat of the electronic components is getting more and more such that it results in electronic ionization and thermal stress in the electronic components to reduce integral steadiness and shorten life span of the electronic components if there is no proper ways to remove the heat.

Referring to FIG. 1, the conventional radiator module includes a fan 11 and a radiator 12. The radiator 12 has a base 121 to tightly contact with a heat generation unit 13 and a plurality of cooling fins 122 extend upward from the base 121. The fan 11 is disposed away the base 121 and on top of the cooling fins 122. The cooling fins 122 are arranged to space apart from each other to form air clearances 123 in between.

The base 121 absorbs the heat from the heat generation unit 13 by means of heat conduction and transmits the heat to the cooling fins 122. The fan 11 drags fluid to move toward the radiator 12. When the fluid passes through the air clearances 123, heat exchange is performed between the fluid and the cooling fins 122 while the fluid flows outward such that the heat of the cooling fins 122 is able to be brought with the fluid to assist heat removal from the heat generation unit 13 indirectly.

However, the preceding conventional structure provides insufficient capability to remove a great deal of increased heat from the heat generation unit 13 and due to the fan 11 being away the base 12, conjunction between the cooling fins 122 and the base 121 accumulates heat with decreased heat conduction to degrade heat dissipation effect deeply while the fluid reaches to the conjunction.

Taiwanese Patent Publication No. M250226, entitled IMPROVEMENT TYPE RADIATOR, includes a heat conduction base, a wind power device, a first cooling member, a second cooling member and at least a heat pipe. The wind power device is disposed upright on the heat conduction base and provides an air inlet side and an air outlet side. The first and second cooling members are corresponding to the air inlet side and the outlet side respectively and form a plurality of first flow passages and second flow passages extending along the same direction. The heat pipe has a heat receiving section fixedly attached to the heat conduction base and another heat receiving section penetrating the first and the second heat dissipation members. Thus, heat from the first and second heat dissipation members is removed by means of the wind power device.

However, the prior art has a problem in practice. It discloses the wind power device is disposed upright on the heat conduction base but there is no further description regarding how the wind power device to connect with the base. According to disclosure of the prior art, the wind power device is positioned upright on the base without being fixedly attached to the base and it is unavoidable to occur vibration and swinging when the wind power device is in running. It can be understood that not only air current is incapable of passing through the first and second heat dissipation members but also the wind power device is very likely to fall off the base such that the integral radiator module is unable to create function of heat dissipation.

Besides, the prior art further discloses a windshield capable of being attached to the heat conduction base to enclose the wind power device and the first and second heat dissipation members. The wind shield has connecting parts corresponding to four corners of the inlet side and the outlet side of the wind power device respectively such that the wind power device can be secured to the wind shield via fasteners passing through the connecting parts and the four corners of the wind power device.

Actually, the first and second heat dissipation members provides protruding plates at both lateral sides thereof respectively to constitute arrangement of spacing apart from each other to prevent the fluid from overflowing outward during passing through the first and second heat dissipation members. However, the wind shield, which covers the heat conduction base, the wind power device, the first and second heat dissipation members and the heat pipe, not only impedes natural convection between the first and second heat dissipation members and foreign cool air but also gathers the heat inside such that capability of forced convection induced by the wind power device is decreased to affect heat dissipation efficiency.

SUMMARY OF THE INVENTION

In order to solve the preceding problems, an object of the present invention is to provide a radiator module structure, which is capable of allowing a frame member with a fan inside being joined to a base steadily without fasteners.

Another object of the present invention is to provide a radiator module structure, which is set up conveniently and fast without aid of additional fasteners and tools.

A further object of the present invention is to provide a radiator module structure, which is able to enhance heat dissipation efficiency.

Accordingly, a radiator module structure according to the present invention includes at least a heat guide pipe, a frame member, a fan and at least two cooling fin sets. The guide pipe has a heat receiving section joined to a base and at least two heat dissipation sections extending upward and being away the base. The frame member is upright disposed on the base and faces the heat receiving section. The frame part of the frame member at least has a clip hook part at the bottom thereof to engage with base and the fan is received in the frame part to respectively face the two cooling fin sets, which are penetrated with the heat dissipation sections.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
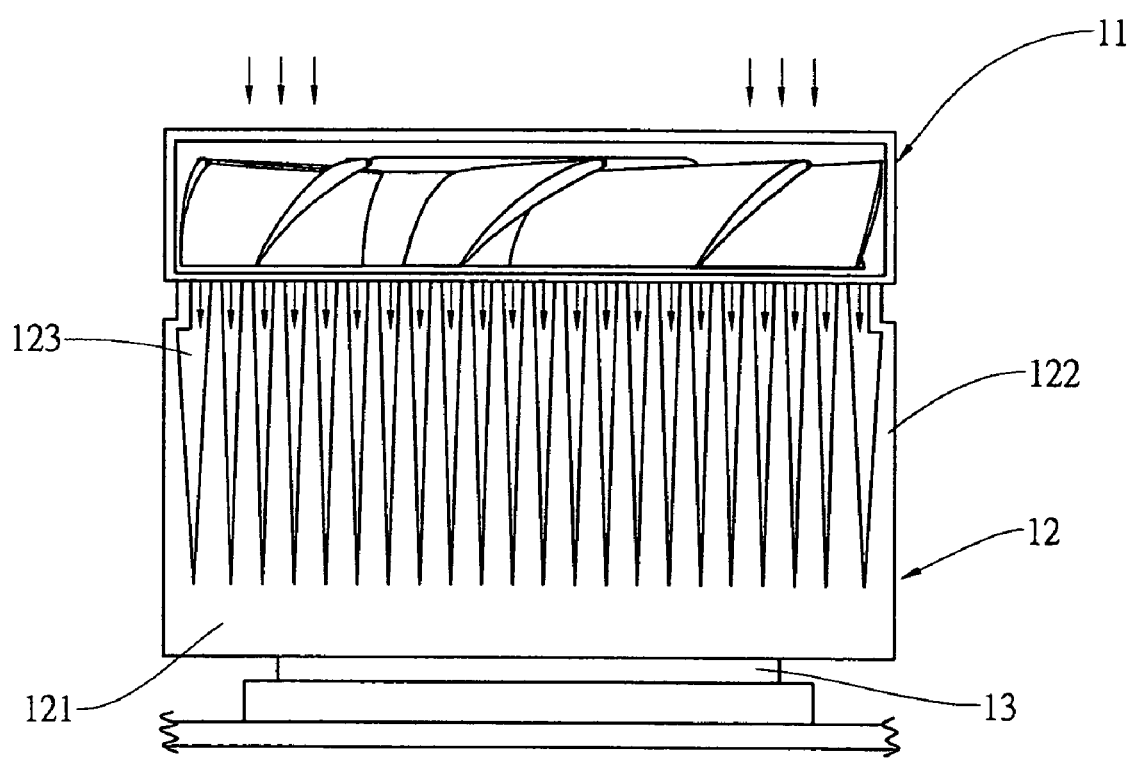
FIG. 1 is a plan view of the conventional radiator.
Figure 2:
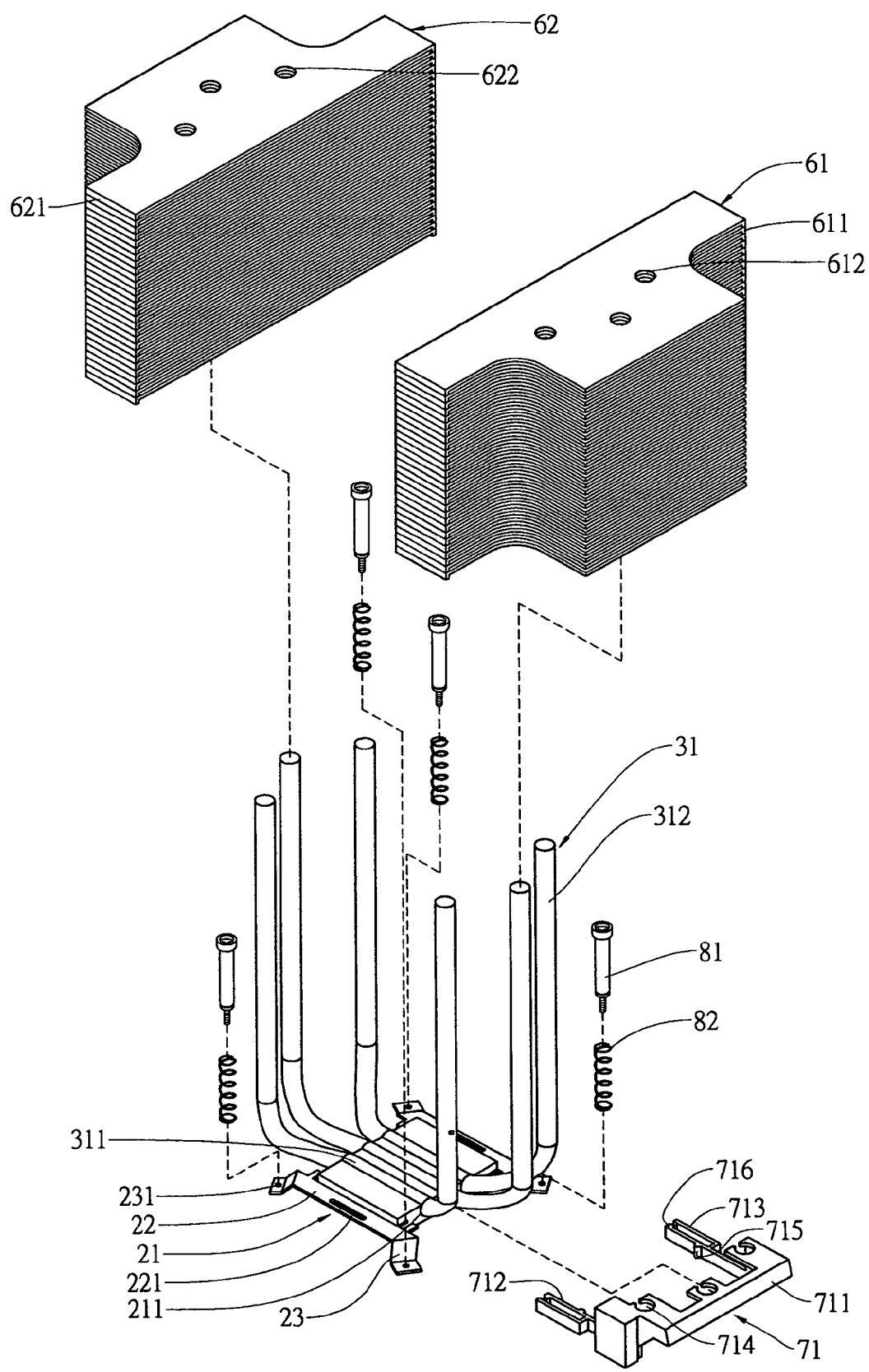
FIG. 2 is an exploded perspective view illustrating the base, heat guide pipes, cooling fins and secure members of a radiator module structure according to the present invention.
Figure 3:
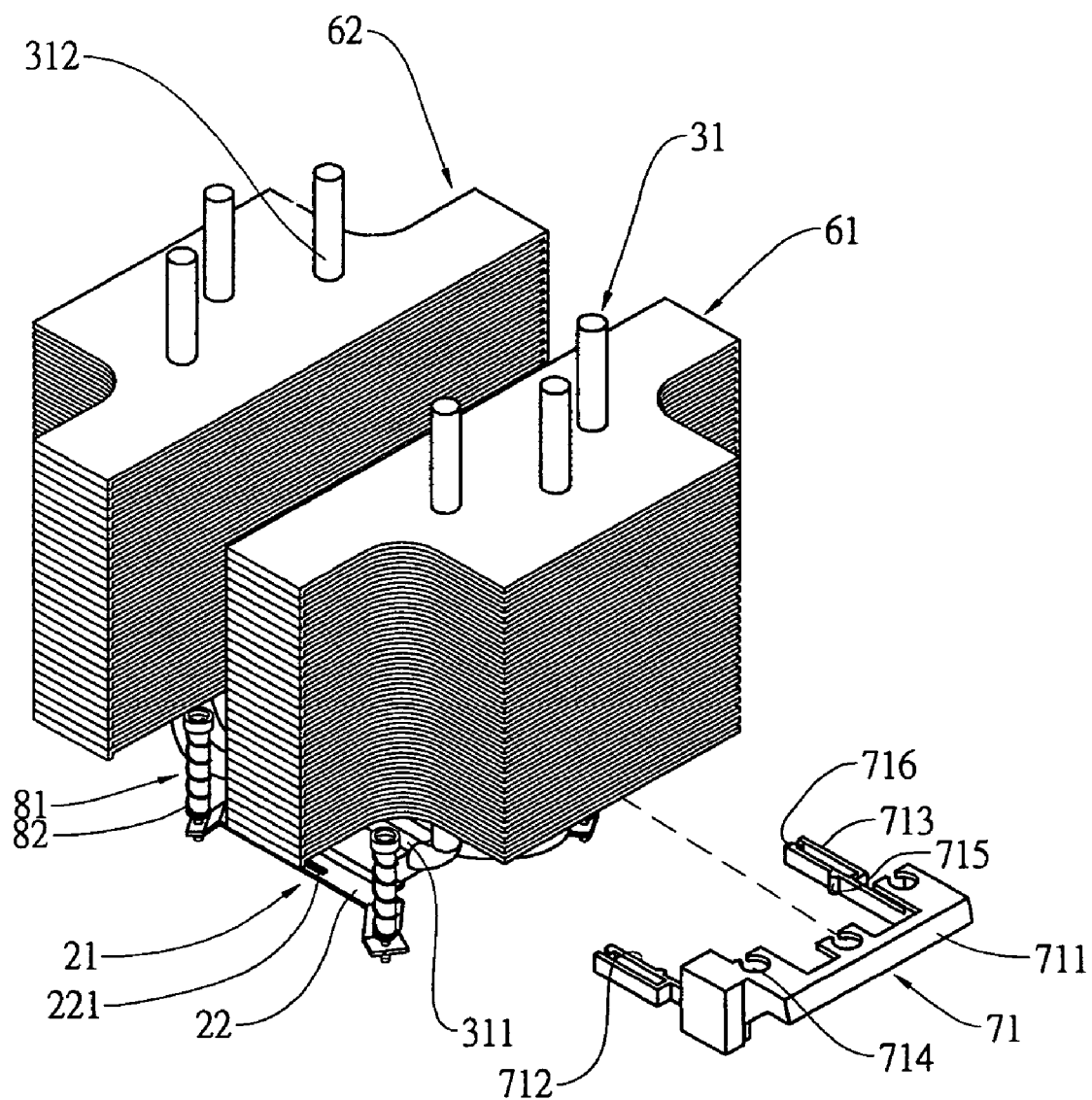
FIG. 3 is an assembled perspective view of FIG. 2.

Referring to FIGS. 2 to 6, a radiator module structure according to the present invention includes a base 21, at least a heat guide pipe 31, a frame member 41, a fan 51, at least two cooling fin sets 61, 62 and a secure member 71. The base 21 is made of high conductive material and contacts with a high heat generation component (not shown) for transmitting heat from the high heat generation component. The base 21 provides at least a recess 211 at a lateral side thereof and at least an insert part 22 at another two opposite sides thereof with a leg part 23 extending outward from both ends of the insert part 22 respectively. The insert part 22 has at least a slot 221 and the leg part 23 has a through hole 231 for being passed through by a fastener 81.

The heart guide pipe 31 has a heat receiving section 311 and a heat dissipation section 312 with the heat receiving section 311 being embedded in the recess 211 and the heat dissipation section 312 upward extending away the base 21.

The two cooling fin sets 61, 62 are formed by way of a plurality of stacked cooling fins 611, 621 respectively and each of the cooling fins 611, 621 provides through holes 612, 622 coincidently to fit with the heat dissipation section 312 of the heat guide pipe 31 such that the cooling fin sets 61, 62 are able to be penetrated with the heat dissipation section 312 disposed oppositely to each other.

The secure member 71 has a main secure member 711 and at least a first arm part 712 and the main secure member 711 at least provides a clip hole 714, which has an edge gap. The first arm part 712 extends outward from both ends of the main secure member 711 and a second arm 713 extends outward from the outer side of the first arm part 712. Further, at least a projection part 715 is provided at the inner side of the first arm part 712 and an inverted hook 716 is disposed at the outer end of the first arm part 712.

Figure 4:
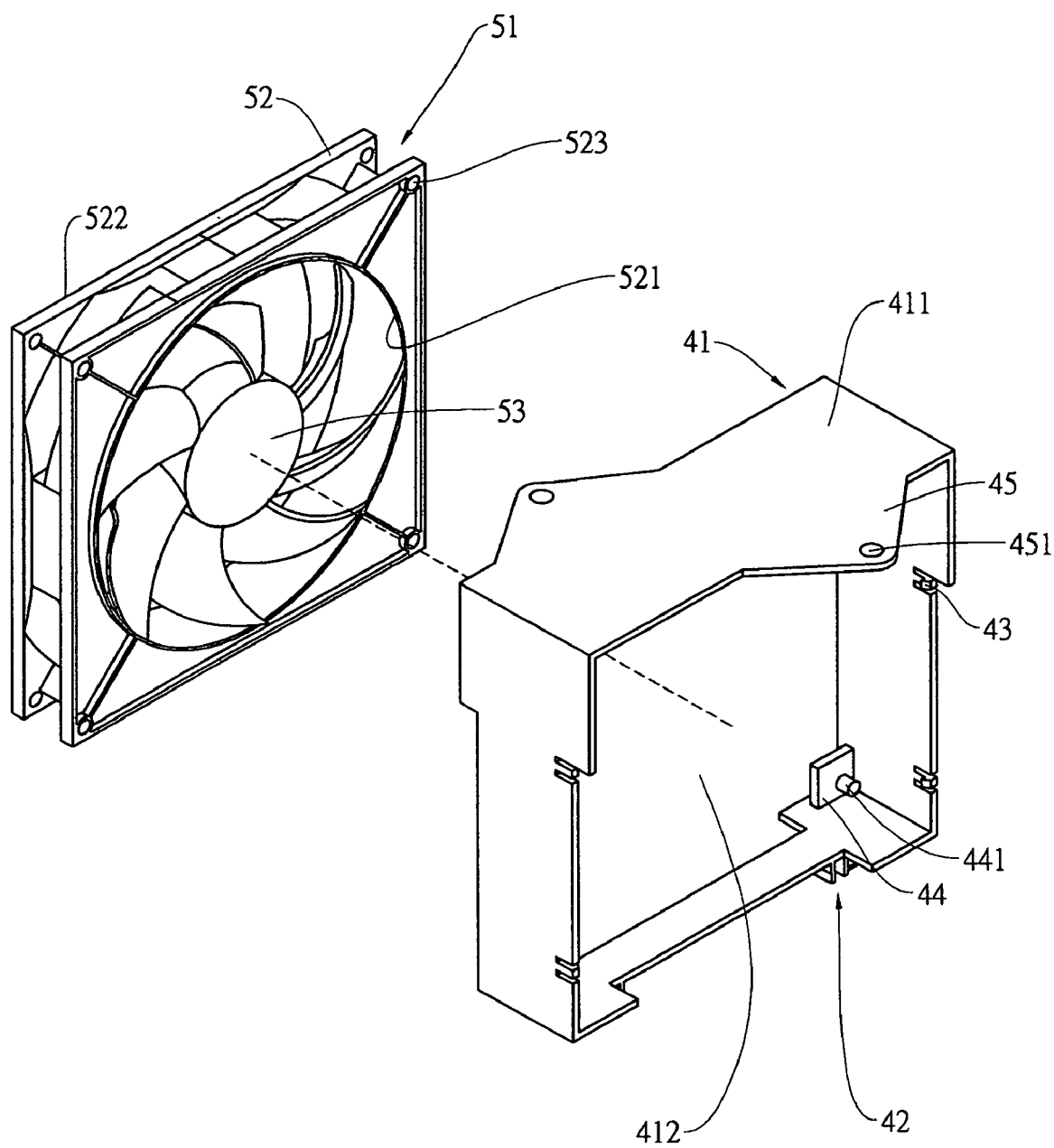
FIG. 4 is an exploded perspective view of the frame member and the fan according to the present invention.
Figure 5:
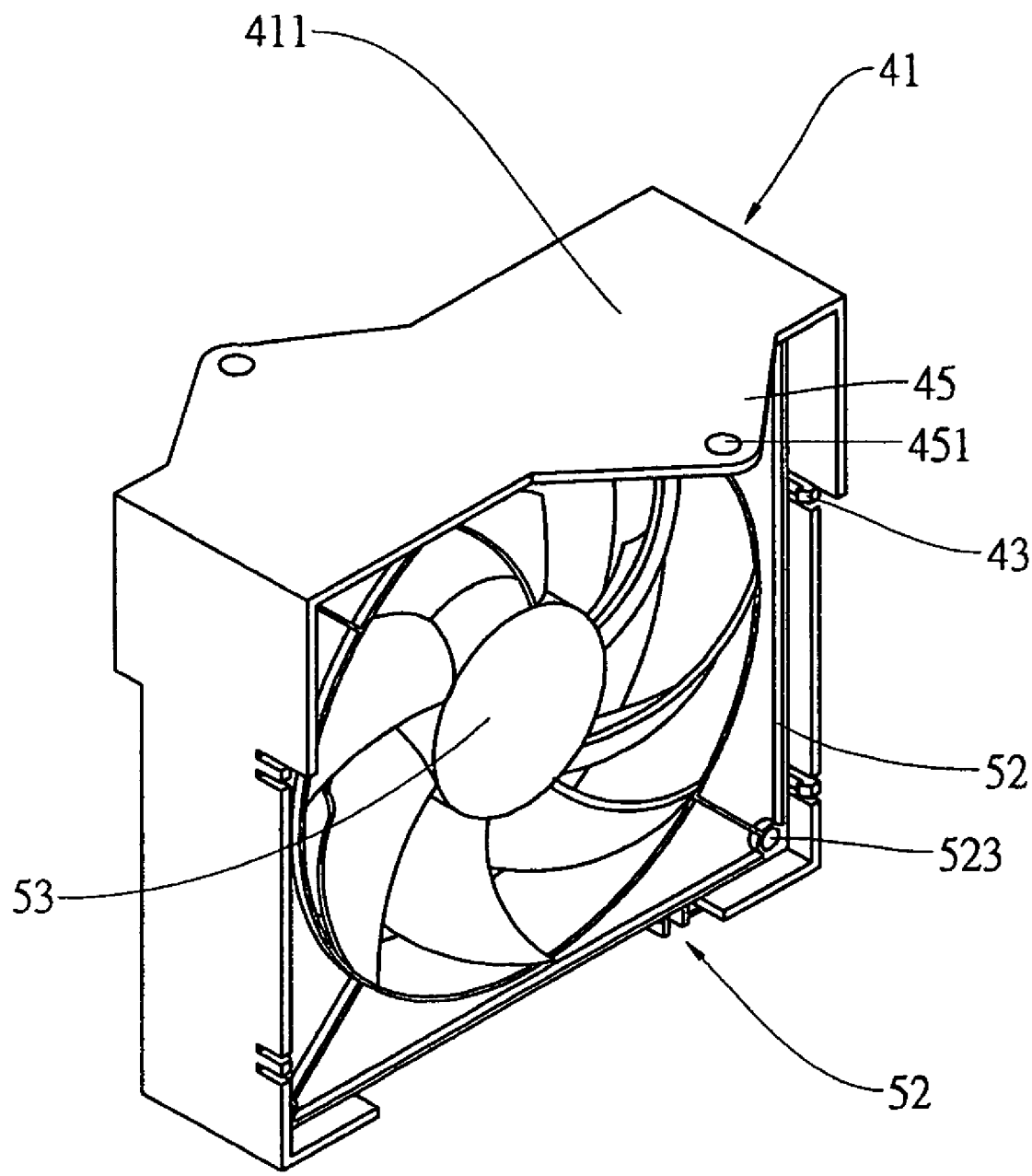
FIG. 5 is an assembled perspective view of FIG. 4.
Figure 6:
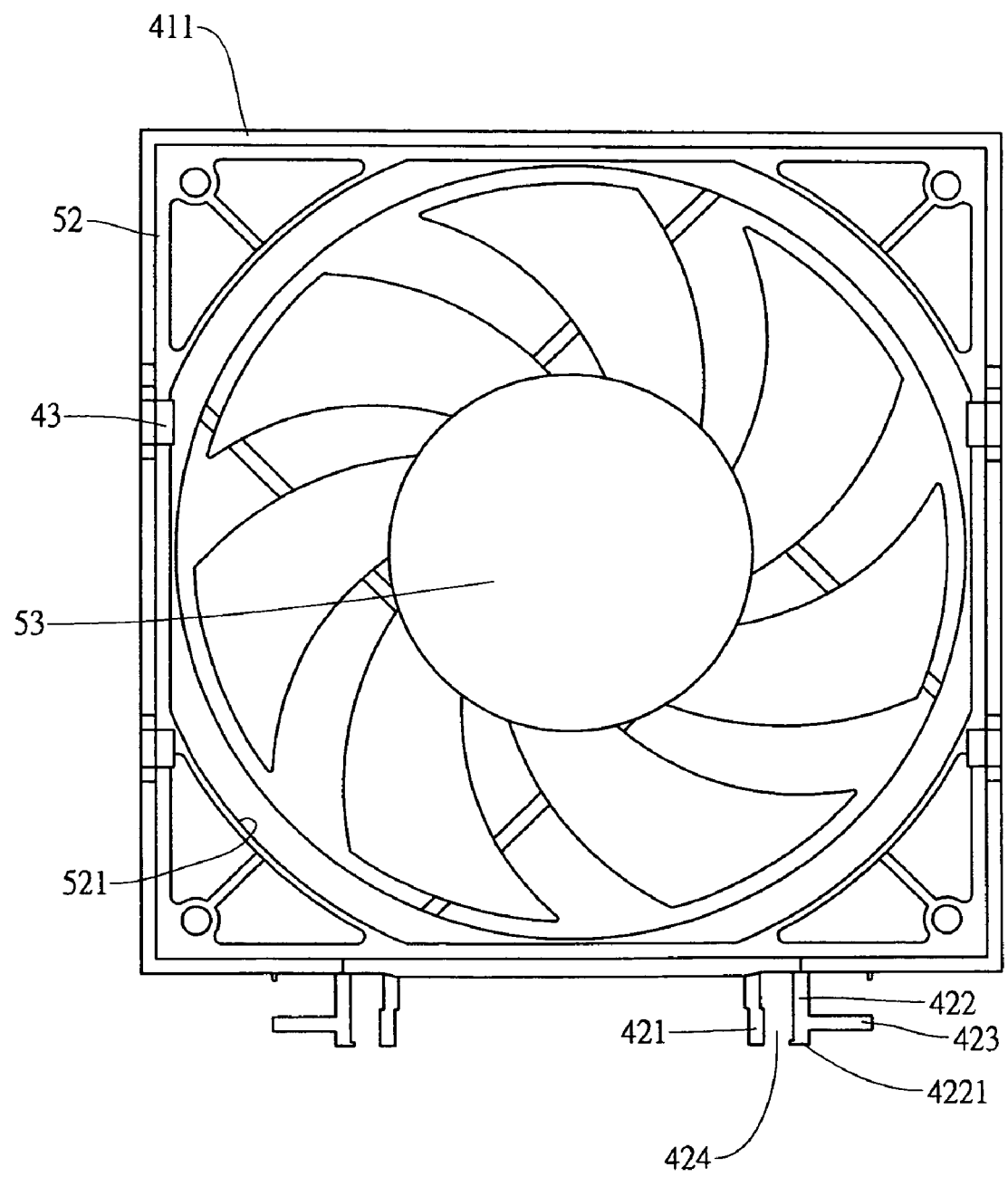
FIG. 6 is a front view of FIG. 5.
Figure 7:
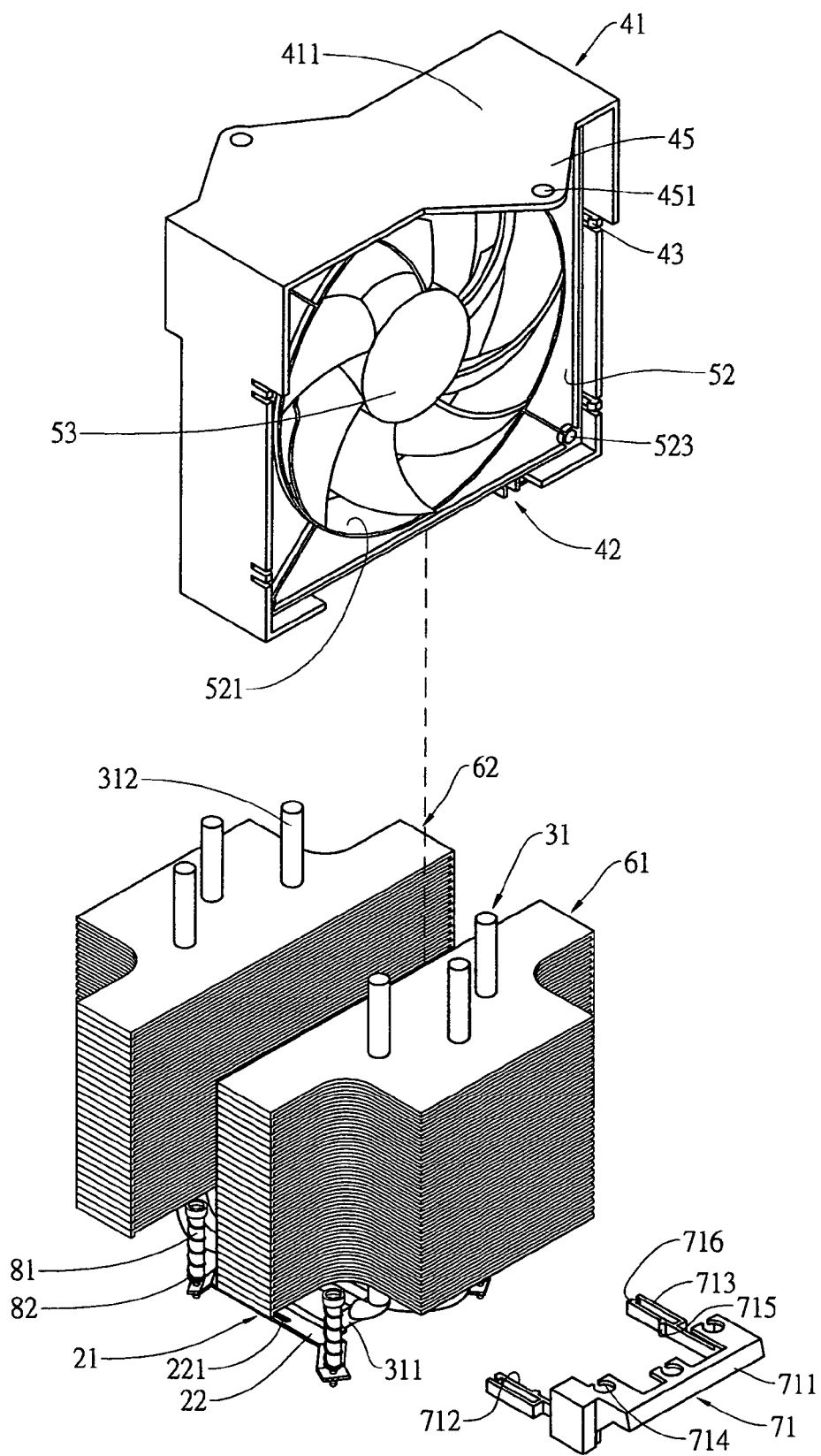
FIG. 7 is an exploded perspective view illustrating the frame with the fan before being mounted to the base of the radiator module according to the present invention.
Figure 8:
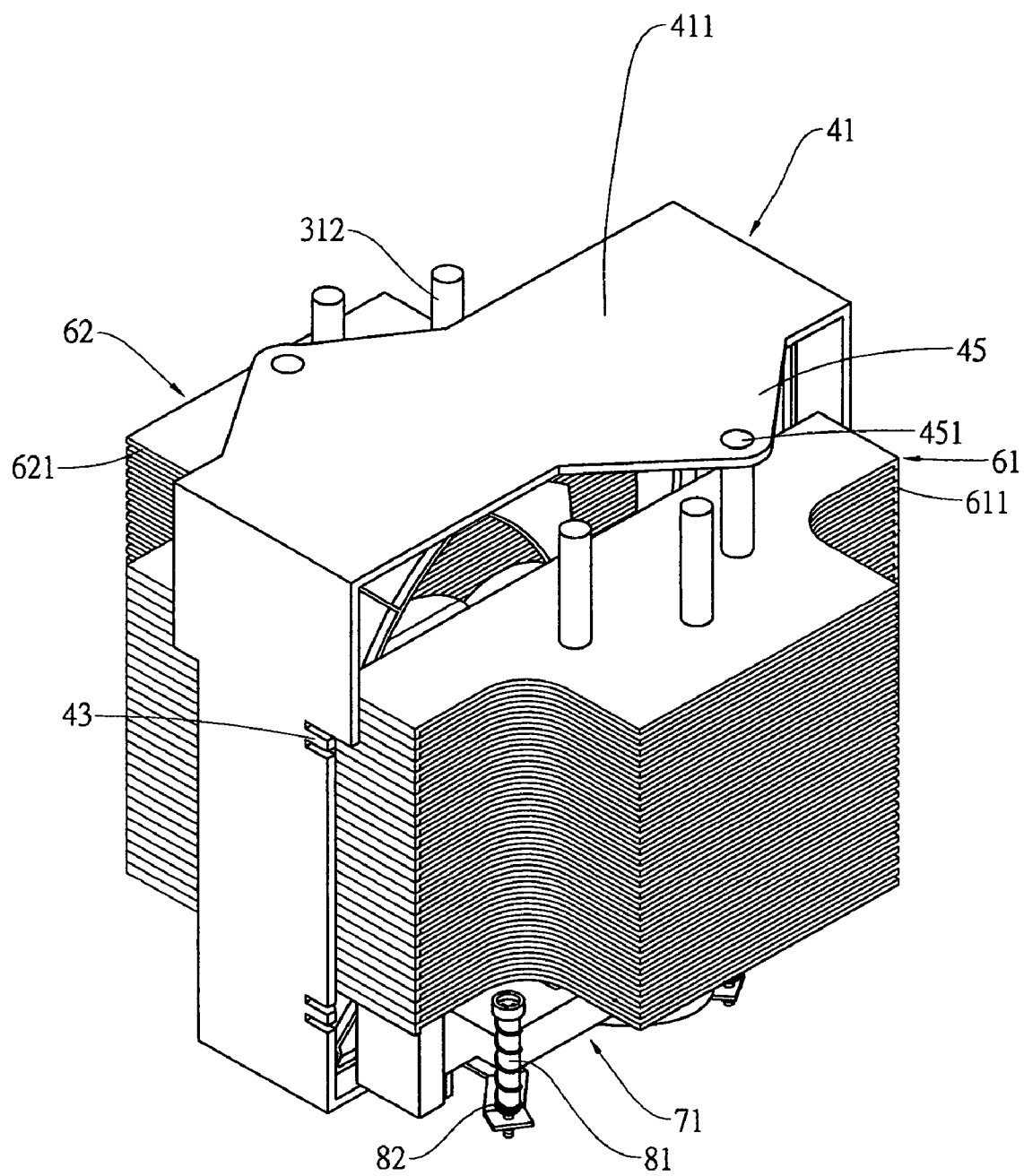
FIG. 8 is a perspective view illustrating the frame with the fan having been mounted to the base of the radiator module according to the present invention.
Figure 9:
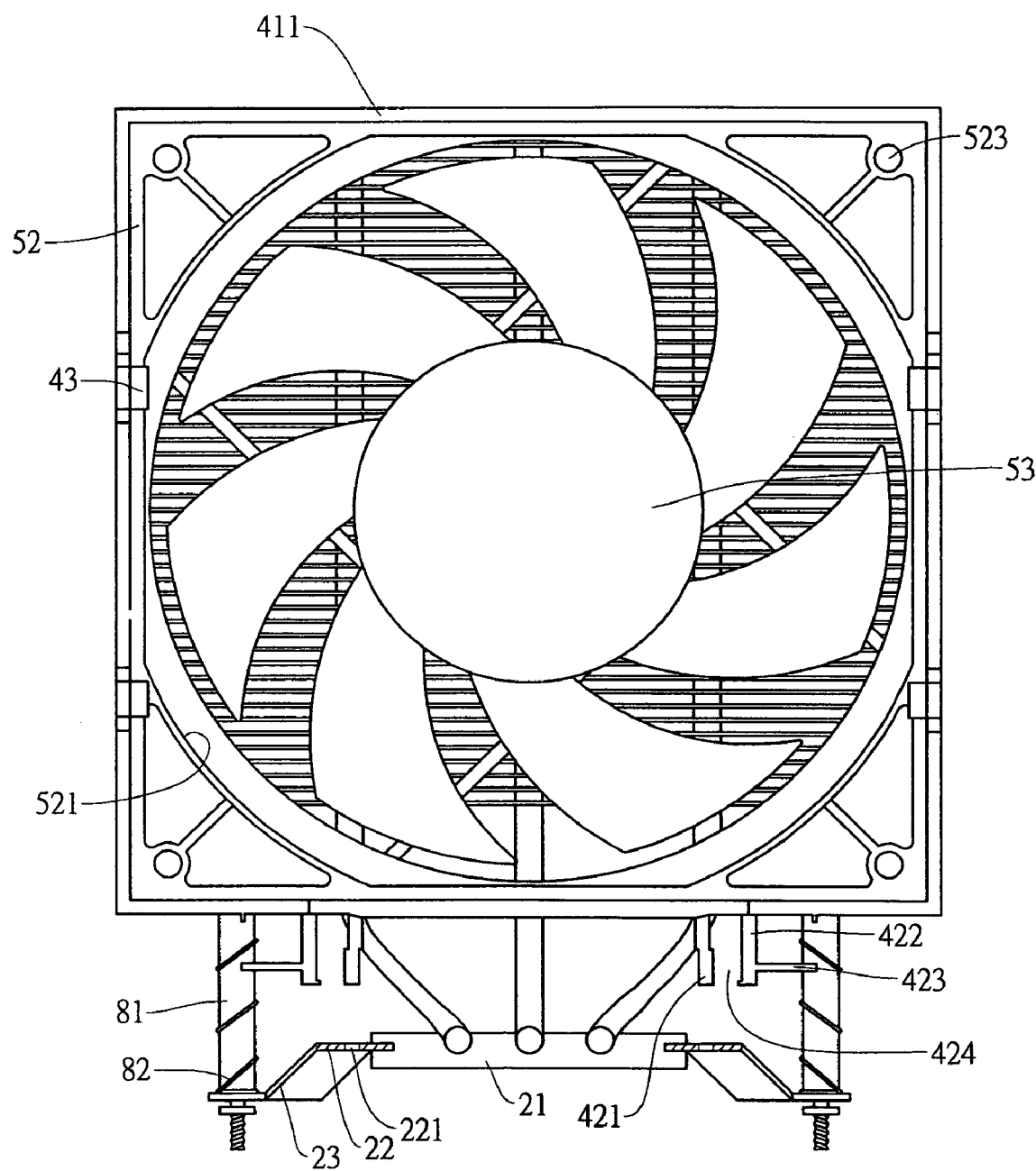
FIG. 9 is a plan view illustrating hook clamps before being inserted into the insertion part.
Figure 10:
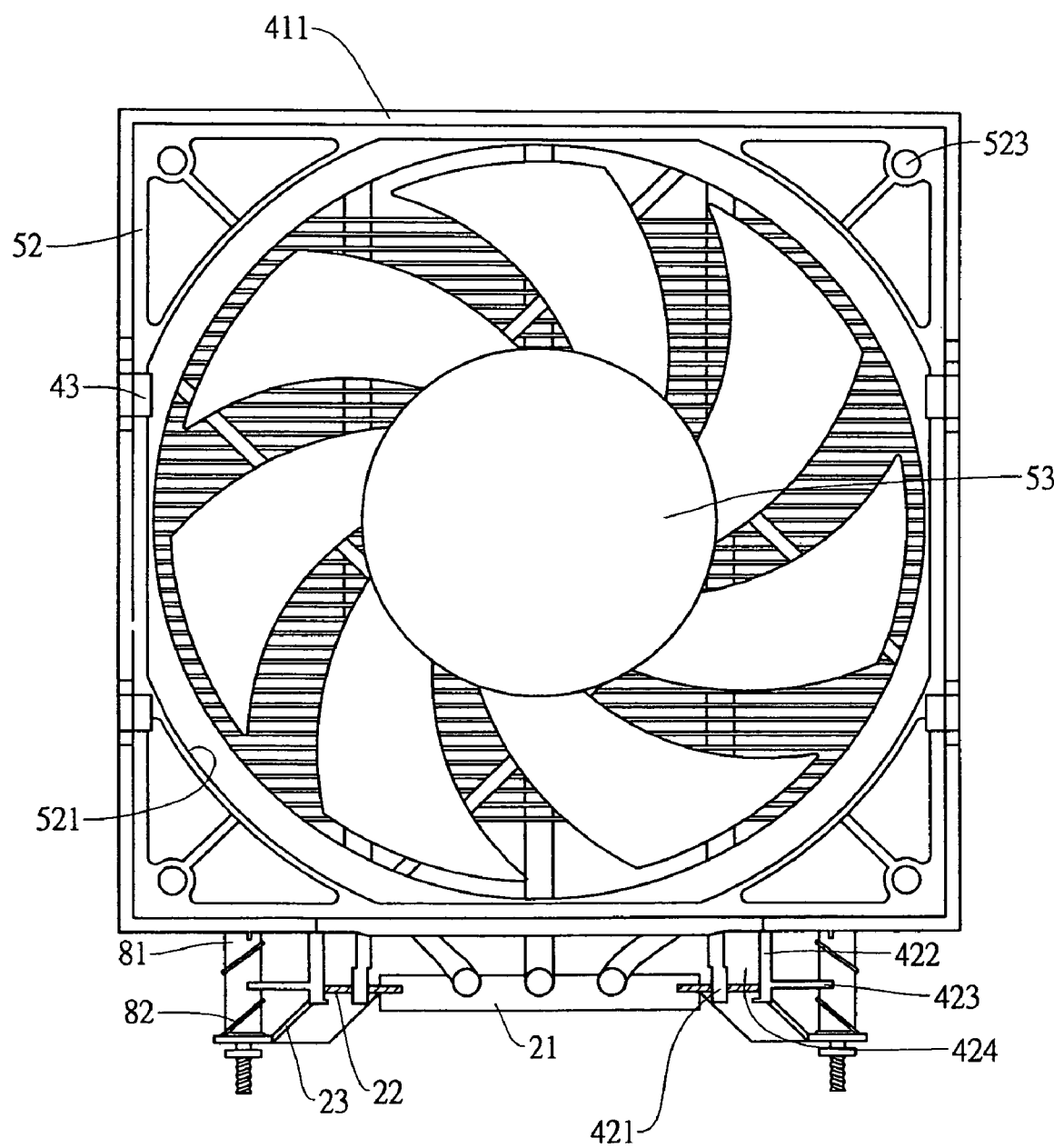
FIG. 10 is plan view illustrating hook clamps after being inserted into the insertion part.
Figure 11:
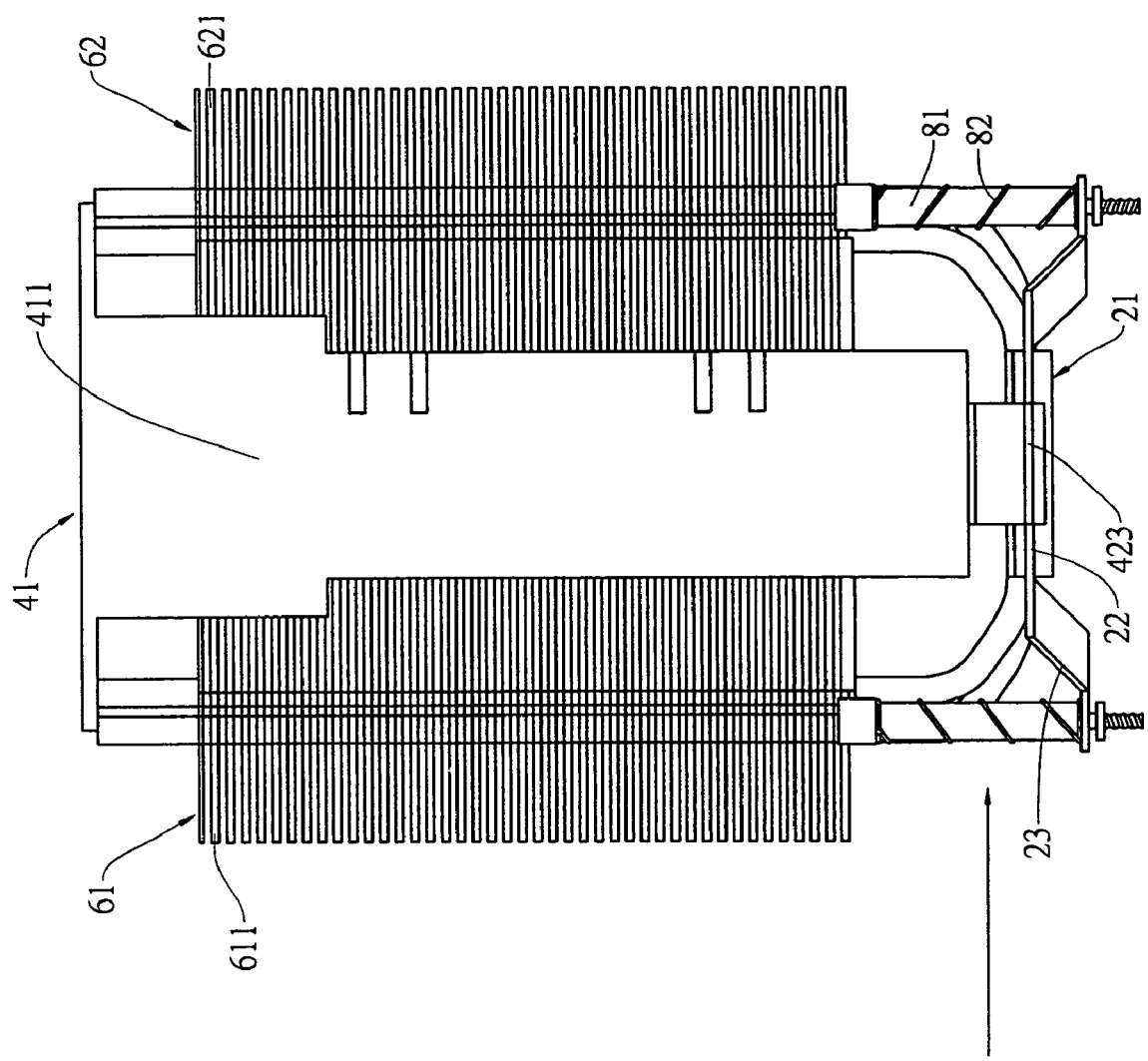
FIG. 11 is a side view illustrating the secure member before inserting into the hook clamps.
Figure 11:
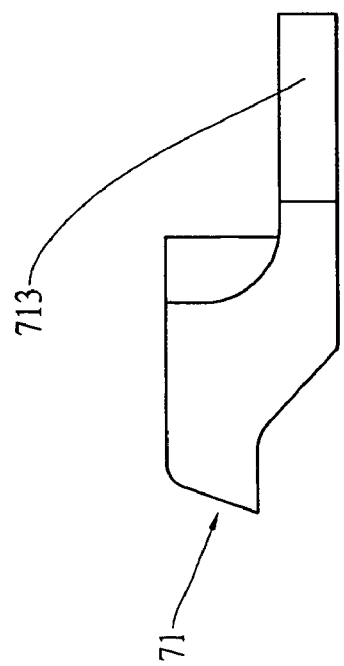
Figure 12:
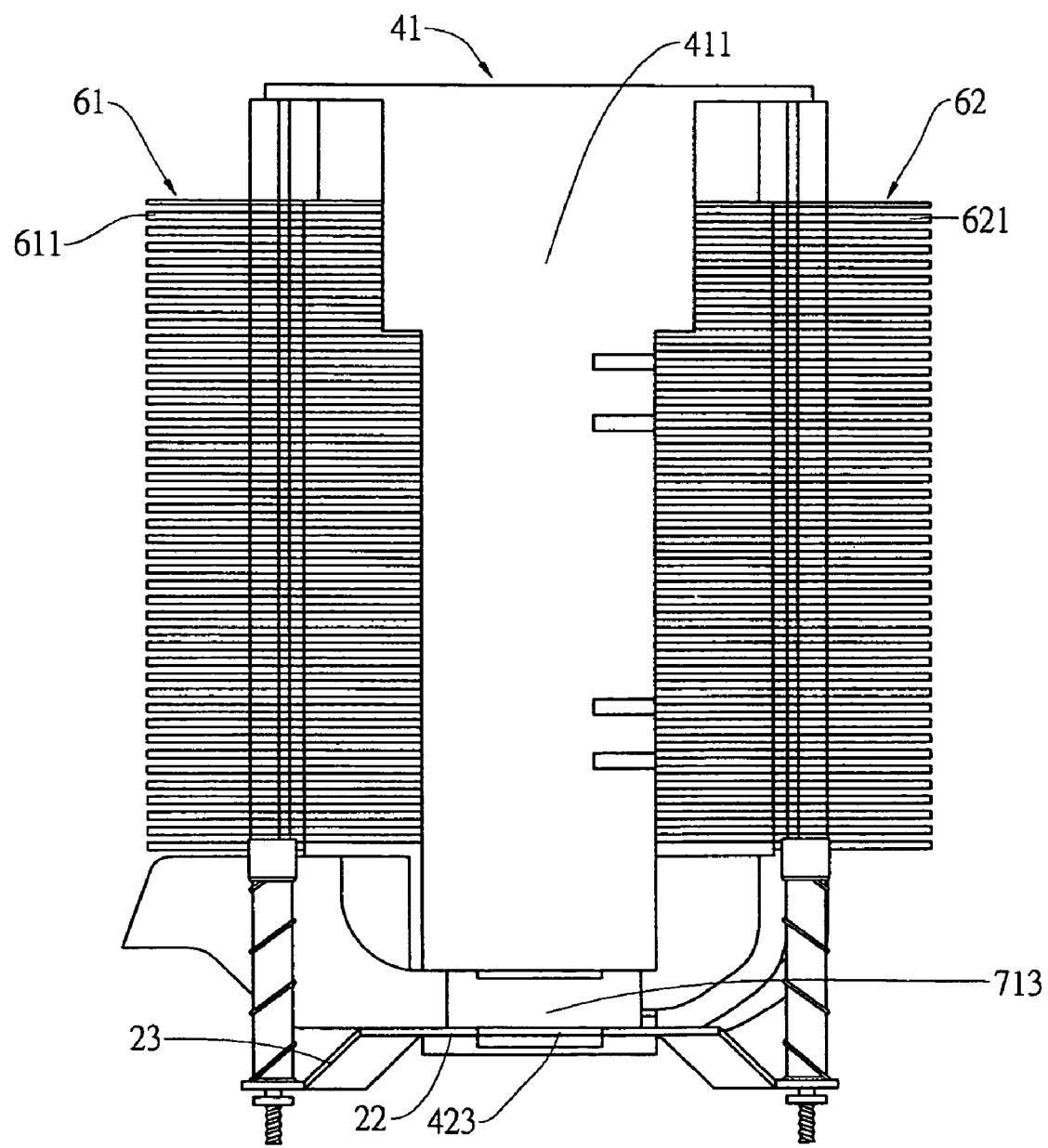
FIG. 12 is a side view illustrating the secure member after inserting into the hook parts.
Figure 13:
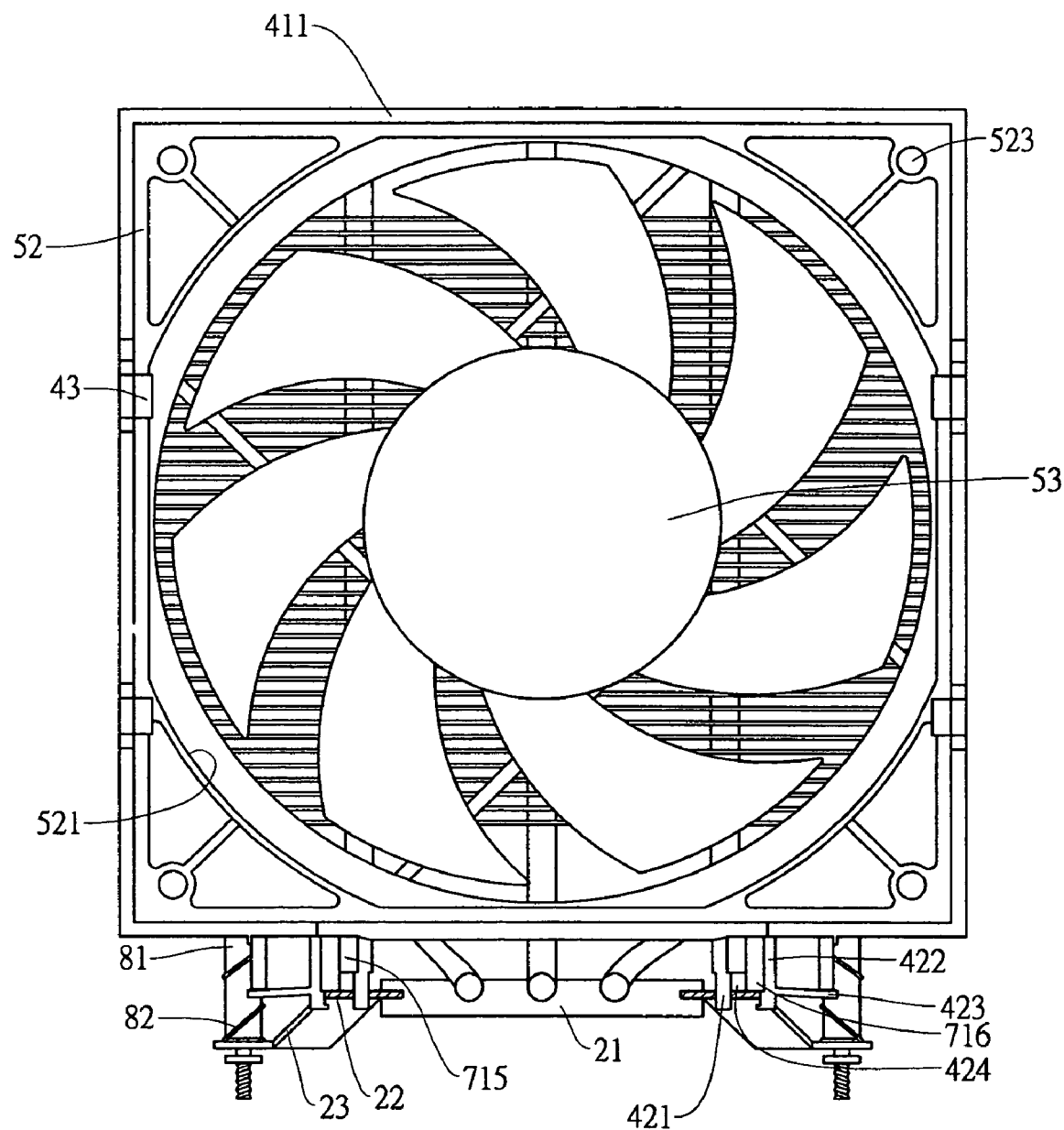
FIG. 13 is a front view illustrating the secure member after inserting into the hook parts.

Referring to FIGS. 4 to 6, the frame member 41 has a continuous frame part 411 to define a hollow area 412 and the frame part 411 at least has a clamping hook part 42 at the bottom thereof extending outward from the bottom of frame edge 411. The clamping hook part 42 includes an upright plate 421 and a catch plate 422 disposed next to the outer lateral side of the upright plate 421. A passage 424 is formed between the upright plate 421 and the catch plate 422. The catch plate 422 has an inverted hook 4221 at the outer end thereof and a press plate 423 extends outward horizontally from the outer side of the catch plate 422 near the inverted hook 4221. The frame part 411 further at least has an inverted part 43 at the periphery thereof and an adapt piece 44 is attached to at four corners of the frame part 411 with a post 441 on the adapt piece 44. A jut plate 45 with a through hole 451 extends outward from the top of the frame part 411.

The fan 51 has a fan frame 52 and a fan wheel 53 rotationally disposed in the fan frame 52. The fan frame 52 forms an air inlet side 521 and an air outlet side 522 with a through hole being provided at four corners of the fan frame 52 respectively in a way of either the inlet side 521 or the outlet side 522 corresponding to the adapt piece 44 and the post 441 passing through the through hole 523 such that the fan 51 is fixedly attached to the frame member 41. Further, the frame part 411 secures the fan frame with the inverted hook part 43 firmly.

Besides, the fan 51 and the frame member 41 shown in the figures are independent of each other and it is known that the fan 51 can be made integral with the frame member 41. The fastener 81 is sleeved with an elastic component 82.

Referring to FIGS. 7 to 13, the frame member 41 and the fan are disposed between the two cooling fin sets 61, 62 in a way of the bottom of the frame member 41 facing the base 21 such that the upright plate 421 inserts into the slot 221 of the insert part 22 and the catch plate 422 and the catch plate 422 is positioned outside the insert part 22 to allow the inverted hook 4221 of the catch plate 422 engaging with the outer spot of the slot 221. The through hole 451 of the jut plat 45 fits with the heat guide pipe 31 for both the frame member 41 and the fan 51 being able to be fixedly attached to the base 21 and face the two cooling fin sets 61, 62. In this way, the inlet side 521 and the outlet side 522 of the fan 42 can face the cooling fin sets 61, 62 respectively. Further, the secure member 71 is moved toward the fan 52 and the first arm part 712 passes through the passage 424 between the upright plate 421 and the catch plate 422 to engage with the catch plate 422 with the inverted hook 716 at the outer end thereof. Meanwhile, the projection part 715 at inner side of the first arm part 712 enters the passage 424 at the same time to create a little friction with the upright plate 421 for enhancing the first arm part 712 being in place firmly. Further, the second arm part 713 moves between the press plate 423 and the bottom of the frame part 411 to bias against the press plate 423 with the solid section thereof so as to prevent the press plate 423 from moving under pressing force and enhance safety of the frame member 41 and the fan 51 on the base 21. Under this circumference, the clip hole 714 is capable of holding the heat guide pipe 31.

In addition, thickness of the frame member 41 is equivalent to or slightly larger than the spacing between the two cooling fin sets 61, 62 to receive a small part of the cooling fin sets 61, 62 such that phenomenon of overflow is avoided when fluid passes through the cooling fin sets 61, 62 and the fan 51.

It is appreciated that the radiator module structure of the present invention not only promotes heat dissipation efficiency but also allows the fan 51 being fixedly attached to the base 21 vertically conveniently, fast and firmly and preventing the fan 51 safely from falling off due to improper foreign force.

While the invention has been described with referencing to preferred embodiments thereof, it is to be understood that modifications or variations may be easily made without departing from the spirit of this invention, which is defined by the appended claims.

What is claimed is:

1. A radiator module structure, comprising:

a base;

at least a heat guide pipe, having a heat receiving section being joined to the base and at least two heat dissipation sections extending upward and being away the base;

a frame member with a frame part, a hollow zone being defined in the frame part with at least a clip hook part at the bottom of the frame part, which is upright disposed on the base and faces the heat receiving section;

a fan with an air inlet side and an air outlet side, being received in the hollow zone and disposed upright on the base with the frame member; and at least two cooling fin sets, each of the cooling fin sets being composed of a plurality of stacked cooling fins, being penetrated with the heat dissipation sections and one of cooling fin sets being opposite to the inlet side and the other one of the cooling fin sets being opposite to the outlet side;

characterized in that the frame part further at least has an inverted hook part itself, at least has an adapt piece therein with a post on it and at least has a jut plate at the top thereof.

2. The radiator module structure as defined in claim 1, wherein the clip hook part extends outward from the bottom of the frame part and includes an upright plate and a catch plate, which is disposed next to the outer side of the upright plate, with a passage between the upright plate and the catch plate.

3. A radiator module structure comprising:

a base;

at least a heat guide pipe, having a heat receiving section being joined to the base and at least two heat dissipation sections extending upward and being away the base;

a frame member with a frame part, a hollow zone being defined in the frame part with at least a clip hook part at the bottom of the frame part, which is upright disposed on the base and faces the heat receiving section;

a fan with an air inlet side and an air outlet side, being received in the hollow zone and disposed upright on the base with the frame member;

at least two cooling fin sets, each of the cooling fin sets being composed of a plurality of stacked cooling fins, being penetrated with the heat dissipation sections and one of cooling fin sets being opposite to the inlet side and the other one of the cooling fin sets being opposite to the outlet side; and a secure member, having a main secure part and a first arm part, the first arm part extending outward from two ends of the main secure part to engage with clip hook part;

characterized in that a second arm part is provided at the outer side of the first arm part and at least a projection part is disposed at the inner side of the first arm part.

4. The radiator module structure as defined in claim 3, wherein the first arm part has an invert hook at the outer end thereof.

\* \* \* \* \*